United States Patent [19]
Little, Jr. et al.

[11] Patent Number: 5,239,402
[45] Date of Patent: Aug. 24, 1993

[54] PUSH-PULL OPTICAL RECEIVER

[75] Inventors: Frank R. Little, Jr., Alpharetta; Herman A. Kruse, Winder; John Megna, Lilburn, all of Ga.

[73] Assignee: Scientific-Atlanta, Inc., Norcross, Ga.

[21] Appl. No.: 481,436

[22] Filed: Feb. 16, 1990

Related U.S. Application Data

[63] Continuation-in-part of Ser. No. 445,299, Dec. 1, 1989, Pat. No. 4,998,012.

[51] Int. Cl.⁵ .................................................. H04B 10/06
[52] U.S. Cl. .................................... 359/189; 359/194; 250/214 A; 330/59
[58] Field of Search ............ 330/10, 59, 255, 262–264, 330/269, 276, 305, 308; 455/619; 359/195, 189, 194; 250/214 A

[56] References Cited

U.S. PATENT DOCUMENTS

| | | | |
|---|---|---|---|
| 3,210,681 | 10/1965 | Rhodes | 330/305 |
| 3,296,463 | 1/1967 | Brault | 330/305 |
| 3,327,238 | 6/1967 | Harwood | 330/305 |
| 3,329,904 | 7/1967 | Horowitz | 330/305 |
| 4,092,610 | 5/1978 | White et al. | 330/10 |
| 4,301,543 | 11/1981 | Palmer | 455/612 |
| 4,415,803 | 11/1983 | Muoi | 250/214 |
| 4,535,233 | 8/1985 | Abraham | 250/214 |
| 4,563,656 | 1/1986 | Baum | 330/308 |
| 4,564,818 | 1/1986 | Jones | 330/311 |
| 4,609,880 | 2/1986 | Dermitzakis et al. | 330/308 |
| 4,620,321 | 10/1986 | Chown | 455/619 |
| 4,641,378 | 2/1987 | McConnell et al. | 455/619 |
| 4,647,762 | 3/1987 | Chown | 250/214 |
| 4,750,216 | 6/1988 | Boyce | 455/617 |
| 4,750,217 | 6/1988 | Smith et al. | 455/619 |
| 4,752,745 | 6/1988 | Pass | 330/265 |
| 4,761,549 | 8/1988 | Mealer, III et al. | 250/214 A |
| 4,897,615 | 1/1990 | Chen | 330/263 |
| 4,968,948 | 11/1990 | Tokumo | 330/10 |
| 4,998,012 | 3/1991 | Kruse | 359/195 |
| 5,013,903 | 5/1991 | Kasper | 250/214 |
| 5,095,286 | 3/1992 | Cole et al. | 330/308 |

FOREIGN PATENT DOCUMENTS

| | | | |
|---|---|---|---|
| 0185199 | 6/1986 | European Pat. Off. | 455/619 |
| 2929083 | 12/1980 | Fed. Rep. of Germany | . |
| 3217309 | 11/1983 | Fed. Rep. of Germany | . |
| 0025333 | 1/1988 | Fed. Rep. of Germany | 330/262 |
| 0142154 | 11/1978 | Japan | 455/619 |
| 0085944 | 7/1981 | Japan | 455/619 |
| 0250928 | 10/1988 | Japan | 455/619 |

OTHER PUBLICATIONS

Millman et al., "Integrated Electronics Analog and Digital Circuits and Systems", 1972 pp. 690–691.

Primary Examiner—Edward L. Coles, Sr.
Assistant Examiner—Kinfe-Michael Negash
Attorney, Agent, or Firm—William A. Marvin; Frederick W. Powers, III

[57] ABSTRACT

A receiver is described for optical signals which are amplitude modulated with broadband radio frequency signals. The receiver includes an optical detector which receives the incoming optical signal and generates a radio frequency electrical signal which varies with the power level of the incoming optical signal. This electrical signal is applied to a pair of amplifiers which are connected in a push-pull relationship. In a preferred embodiment, a tuning network is connected between the two amplifiers for optimizing the amplification of a selected band of radio frequencies.

19 Claims, 3 Drawing Sheets

PUSH-PULL OPTICAL RECEIVER

This application is a continuation-in-part of application U.S. Ser. No. 445,299 by Kruse filed Dec. 1, 1989 and entitled "Fiber Optic Transimpedance Receiver", now U.S. Pat. No. 4,998,012, which is commonly assigned with the present application. The disclosure of Kruse is hereby incorporated by reference herein.

FIELD OF THE INVENTION

The present invention relates to optical transmission systems and more particularly to an optical receiver with improved dynamic range for receiving optical signals which are amplitude modulated with wideband video signals.

BACKGROUND OF THE INVENTION

In recent years, there has been a great deal of interest in the transmission of video signals via optical fiber. This mode of signal transmission offers a number of advantages over transmitting signals over conventional 75 ohm coaxial cable as video signal distribution is now commonly accomplished in CATV systems. Optical fibers intrinsically have more information-carrying capacity than do coaxial cables. In addition, there is less signal attenuation in optical fibers than in coaxial cable adapted for carrying radio frequency signals. Consequently, optical fibers can span longer distances between signal regenerators than is possible with coaxial cable. Further, the dielectric nature of optical fiber eliminates any problems with electrical shorting. Finally, optical fiber is immune to ambient electromagnetic interference (EMI) and generates no EMI of its own.

Amplitude modulation of an optical signal with a wideband radio frequency signal requires a light modulating device, such as a laser, which has linear characteristics over a wide dynamic range of operation.

Until recently it has been difficult to fabricate lasers in which the relationship between input current and optical output was linear over more than an extremely limited range. Because of the difficulty in obtaining lasers which were sufficiently linear to support analog amplitude modulation, digital modulation was, until recently, the primary means for transmitting information by optical signals. Digital modulation does not require a laser with a large dynamic range as do analog means for transmitting information (e.g. amplitude modulation or frequency modulation of a carrier frequency modulating the laser output). Digital modulation of the laser offers high signal quality and is also compatible with telephone trunk and feeder networks. However, because of the wideband nature of video signals digitization of these signals consumes extremely large amounts of channel capacity. A typical video signal occupies 6 Mhz of bandwidth. Transmission of this information digitally requires a digital data transmission rate of approximately 45 megabits per second. High definition video (HDTV) may require a digital data transmission rate of up to 145 megabits per second. Moreover, encoders and decoders for converting analog video signals to digital form and for reconverting these digital signals to analog form for viewing on a conventional television set are quite expensive. Consequently, analog transmission of video signals is potentially much more economical than digital transmission of such signals.

Recent advances in laser technology have made analog modulation of optical signals feasible. Currently available Fabry-Perot (FP) and Distributed Feedback (DFB) lasers have sufficiently linear characteristics to allow them to be used as analog modulators of optical signals.

One such means of analog transmission is to use a baseband television signal to frequency modulate a radio frequency carrier. This modulated radio frequency carrier is in turn used to modulate an optical signal. Such frequency modulation is less susceptible to noise than is amplitude modulation, but it requires more bandwidth for each television channel transmitted than is required by amplitude modulation. Thus, the number of television channels which can be carried by each optical transmission (e.g., each optical fiber) in an FM-based system may be somewhat limited. Moreover, since the standard NTSC format for video calls for amplitude modulation of the video carrier, means for converting FM signals to an NTSC amplitude modulated format are required either at the television receiver or at the point at which the fiber transmission trunk is connected to a coaxial cable distribution network. The need for such FM to NTSC AM conversion increases the cost of the system.

In view of the above, a system in which the video baseband signal amplitude modulates a radio frequency carrier signal, which in turn amplitude-modulates an optical signal, is preferable to other systems from the standpoint of cost and simplicity. Even so, several phenomena limit the number of radio frequency channels which can be carried by present day optical links where the intensity of light signals is amplitude modulated. A first of these phenomena is a limitation of the amount of radio frequency energy which may be supplied as a modulating signal to a laser or other light generating device before various types of distortions are generated by the light generating device. This power limitation relates to the sum of the radio frequency power contributions of each radio frequency channel. Thus, if it is desired to transmit 80 radio frequency channels over a single optical link, the power available for each channel is only half of the power which would be available if only 40 channels were transmitted by the optical link. Such a limitation on the power of each radio frequency carrier brings each of these carriers closer to the "white noise" level of the system, thus, adversely affecting the signal to noise ratio of the system. Decreasing the number of channels carried by each optical link in order to improve the signal to noise ratio increases the number of lasers which must be used and the overall complexity and cost of the system. On the other hand, increasing the amount of radio frequency power supplied to a laser beyond certain limits may cause the laser to produce several types of distortion which are discussed below.

When the modulating signal supplied to a laser causes the laser to be driven into a nonlinear portion of its input-signal-to-light-output characteristic, harmonic distortion may be produced. The products of this type of distortion are signals which are integer multiples of the "primary" frequency. The second harmonic of 54 MHz is, for example, 108 MHz. Thus, if the bandwidth accommodated by a system is such that there are channels at both 54 MHz and 108 MHz, second harmonics of the 54 MHz channel will interfere with the signals on the 108 MHz channel.

Intermodulation distortion is also of particular concerns in amplitude modulated systems. Such distortion results in distortion products at frequencies which are the sum or difference of two other frequencies. The distortion products are the sum difference of two primary frequencies are called second order distortion products and are particularly troublesome. For example, a video channel at 150 MHz and another video channel at 204 MHz may produce a second order distortion product at 54 MHz (the difference frequency) and at 354 MHz (the sum frequency). Third order distortion products are produced by the mixing of a primary frequency with a second order distortion product. This produces third order distortion products at the sum and difference between the primary frequency and the frequency of the second order distortion product. Third order distortion products may also be generated by mixing signals at three frequencies or by third harmonic generation.

Clearly, one method of dealing with the above problems is to utilize detectors and amplifiers which are highly linear and which are thus relatively insusceptible to haromonic and intermodulation distortion. It is especially important that the production of second order distortion products be minimized. "Optical Receivers" are combinations of such detectors, and amplifiers which serve to convert amplitude modulated light to conventional broadband RF output signals comprising multi-channel video and/or data carriers. Such optical receivers should be effective over a bandwidth of approximately 50 MHz to 550 MHz so as to be compatible with current coaxial cable transmission technology. It is desireable that an optical receiver be effective at frequencies greater than 550 MHz in order to accommodate additional bandwidth which may be required in future CATV systems.

Detectors for converting amplitude modulation of an optical signal to a radio frequency electrical signal corresponding to the modulation may comprise, for example, a photodiode such as the PIN-55D manufactured by PCO Inc. of Chatsworth, Calif. This type of device produces an output current corresponding to the amplitude of light applied to it.

One type of amplifier which has been used for converting the output current signal from such a photodiode to a voltage signal suitable for transmission on a conventional 75 ohm coaxial CATV cable is known as a high impedance amplifier. A generalized schematic of such a high impedance amplifier is shown in FIG. 1. The capacitor C1 of the circuit is essentially a short circuit to radio frequency signals but blocks any DC current from being transmitted. Optical energy from an optic fiber 1 is coupled through a photodiode 2 which acts as an optical power to electrical current converter. This current flows through R1 and R2 producing a corresponding radio frequency (r.f.) voltage signal at the base of a field effect transistor ("FET") Q1. The output of the FET Q1 drives a 75 ohm coaxial cable through a capacitor C4. A problem associated with the use of such a high impedance amplifier for amplifying a broadband signal is that, at the frequencies in question, the distributed capacitance of the circuit to ground ($C_d$) coupled with the relatively high input impedance of the circuit tends to attenuate the high frequency response of the circuit ("high frequency roll-off"). Adding additional circuitry to flatten this response can degrade the performance of the circuit with respect to noise and distortion.

A type of amplifier which tends to avoid the high frequency roll-off problem associated with high impedance amplifiers is known as a transimpedance amplifier. A simplified version of such a transimpedance amplifier is shown in FIG. 2. This illustrative transimpedance amplifier is similar to the high impedance amplifier of FIG. 1 except for the addition of a feedback path comprising a resistor $R_f$ and a capacitor $C_f$ between the drain and gate of the field effect transistor Q1. A characteristic of this circuit is that its input impedance is approximately equal to $R_f$ divided by 1 plus the transconductance ($G_m$) of the circuit ($R_f/1+G_m$). Thus, depending on the selection of an appropriate resistance value for $R_f$, the input impedance of a transimpedance amplifier with a gain of 9 may be in the order of 100 ohms as compared with a similar high impedance amplifier which could have an input impedance of 3.5 kilohms or higher. This relatively low input impedance minimizes the problem of high frequency roll-off in the 50 to 550 MHz frequency band.

Transimpedance and high frequency amplifiers are both susceptible to second order and other even and odd order distortion problems when they are used for the amplification of a high number of television carrier frequencies. In high impedance amplifiers these distortion products tend to be more severe at the low end of the frequency band. In transimpedance amplifiers the problem of second order distortion products is essentially the same throughout the band of operation.

SUMMARY OF THE INVENTION

The present invention provides an optical receiver which is considerably more linear than previous receivers for the frequency band in question. This linearity substantially alleviates harmonic and intermodulation distortion problems experienced by previous optical receivers.

In accordance with the present invention, the nonlinearity of the amplifier circuitry of the receiver is effectively cancelled out by using a pair of matched amplifier stages connected in a push-pull configuration. Since the nonlinearities of each of these amplifier stages is relatively similar the balanced configuration of a push-pull amplifier tends to cancel out these nonlinearities and thus alleviate the problem of both even and odd harmonics and intermodulation products of the input frequencies being produced.

In a presently preferred embodiment of the invention, the signals produced at the output of a photodiode are fed to the inputs of a pair of transimpedance amplifier stages. The outputs of each of these transimpedance stages feed respective high impedance buffer amplifiers. These high impedance buffer amplifiers are connected in a push-pull configuration to opposite ends of the primary winding of an output transformer. A center tap of the primary winding of the transformer is grounded through a blocking capacitor to provide a radio frequency ground. The secondary winding of the output transformer may be adapted to feed conventional 75 ohm coaxial CATV cable equipment through an optional equalization network. A further feature of the preferred embodiment is a tuning network which may be connected between the inputs to the two transimpedance stages. This tuning network optimizes the performance of the amplifier within a preselected band of frequencies.

It is an object of the present invention, therefore, to provide a broadband optical receiver which is relatively insusceptible to harmonic and intermodulation distortion.

It is a further object of the present invention that the receiver have a relatively flat frequency response over a broad range of radio frequency modulation of the optical input signal.

It is still a further object of the present invention that the above receiver be implementable in so as to allow the input impedance of its amplifier to be selected in accordance with the anticipated strength of the optical signal.

The above and further objects and advantages of the invention will become apparent with reference to the detailed disclosure of the invention below and the accompanying illustrative figures in which.

Figure 1:
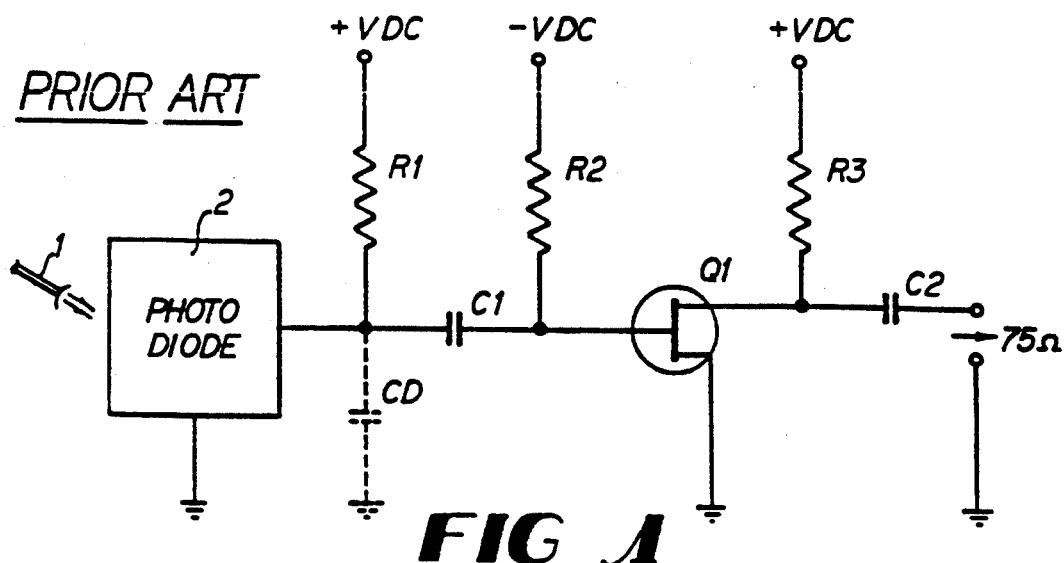
FIG. 1 is a schematic of and illustrative example of a high impedance amplifier of the prior art.
Figure 2:
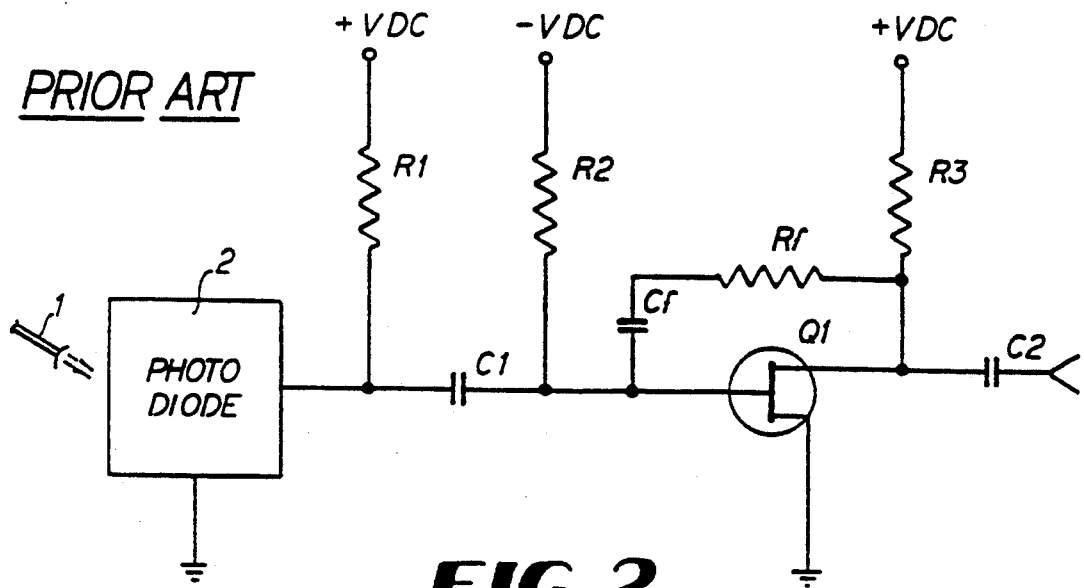
FIG. 2 is an illustrative example of a transimpedance amplifier of the prior art.
Figure 3:
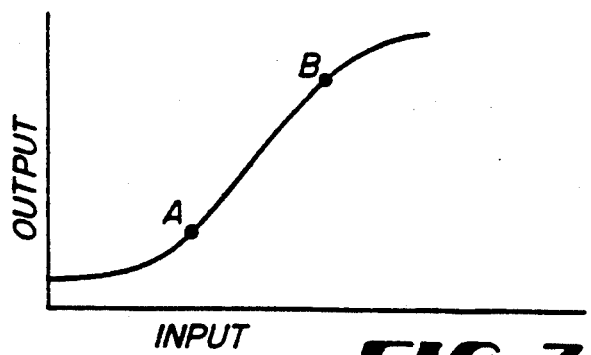
FIG. 3 is a graph showing the relationship between input voltage to output voltage in a typical single-ended amplifier.

In single-ended amplifiers of the prior art (e.g., the high impedance and transimpedance amplifiers discussed above), the distortion components which present the most serious problems are second order intermodulation products. Such second order products are formed when any two frequencies are applied at the input of the amplifier. The output signal of the amplifier will include not only the primary input frequencies but also frequency components equal to the sum and to the difference of these two input frequencies. In a broadband amplifier, these sum and/or difference frequencies may be within the frequency band of interest and thus interfere with another primary input signal. In an ideal amplifier in which there is a linear relationship between input signal and output signal, second order distortion products are not produced. However, a more realistic relationship between input voltage to output voltage in a broadband amplifier is illustrated by FIG. 3. As noted from FIG. 3 there is a linear range between the points A and B of the curve. Input signals ranging below point A or above point B result in distorted output signals. It has been found that by utilizing two amplifiers in a push-pull relationship, the nonlinearities in the input/output characteristics of the two amplifiers can be made to compensate for one another, thus, diminishing distortion due both to even and odd harmonic frequencies being produced. This arrangement has been found especially helpful for reducing second order distortion.

Figure 4:
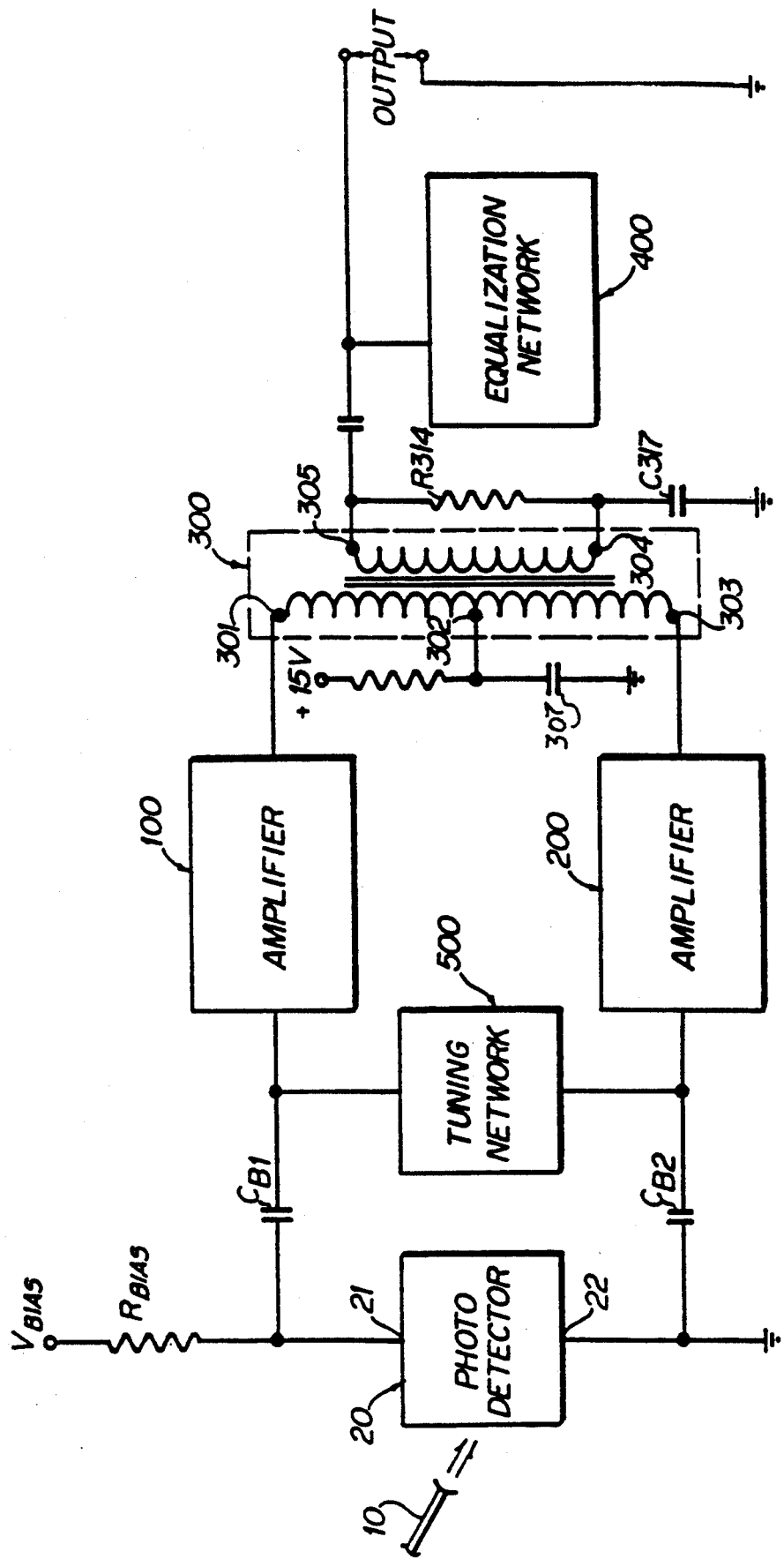
FIG. 4 is a block diagram of a broadband push-pull amplifier in accordance with the present invention.

FIG. 4. shows a simplified block diagram of a broadband optical receiver in accordance with the present invention. An optical fiber 10 carries an amplitude modulated optical signal to a photodetector 20. This photodetector may, for example, be a photodiode which is appropriately biased by a DC bias voltage ("$V_{Bias}$") applied through an appropriate biasing network comprising resistors $R_{Bias1}$ and $R_{Bias2}$ to produce a DC current between terminals 21 and 22 of the photodetector when the photodetector is excited by the optical input signal. The DC current between terminals 21 and 22 includes an AC component which corresponds to the AC signal modulating the optical signal. It is typical that this AC component will range between 50 MHz and 550 MHz or higher. The AC component is separated from the DC signal by blocking capacitors $C_{B1}$ and $C_{B2}$ and amplified by amplifier stages 100 and 200. The outputs of the amplifiers 100 and 200 are connected to terminals 301 and 303 respectively of transformer 300 which may be a ferrite core transformer of the type commonly used in broadband r.f. applications. The primary winding of the transformer 300 is center tapped at a terminal 302 and this terminal 302 is connected through a capacitor 307 to ground, which at the frequencies in question effectively connects the center tap to ground. The secondary winding of the output transformer 300 may have an optional resistor, such as resistor R314, of 150 to 500 ohms connected across it in order to facilitate a better match between the transformer output and the 75 ohm system impedance for further distribution of the RF signals in a CATV network.

Optionally, a frequency response equalization network 400 may be employed at the output of the transformer 300 to help flatten out any nonlinearities in the frequency response due to imperfections in the circuitry. Amplifiers 100 and 200 may be any type of amplifier suitable to amplifying the output of a photodiode such as a high impedance amplifier or transimpedance amplifier. Preferably, however, as set forth below in the description of the presently preferred embodiment, amplifiers 100 and 200 are of the transimpedance type. Another optional feature of the present invention is a tuning network 500 connected between the inputs to the amplifiers 100 and 200. As discussed in greater detail below, this tuning network 500 serves to peak the frequency response of the entire circuit about the geometric mean of the center of the desired band of operation.

Figure 5:
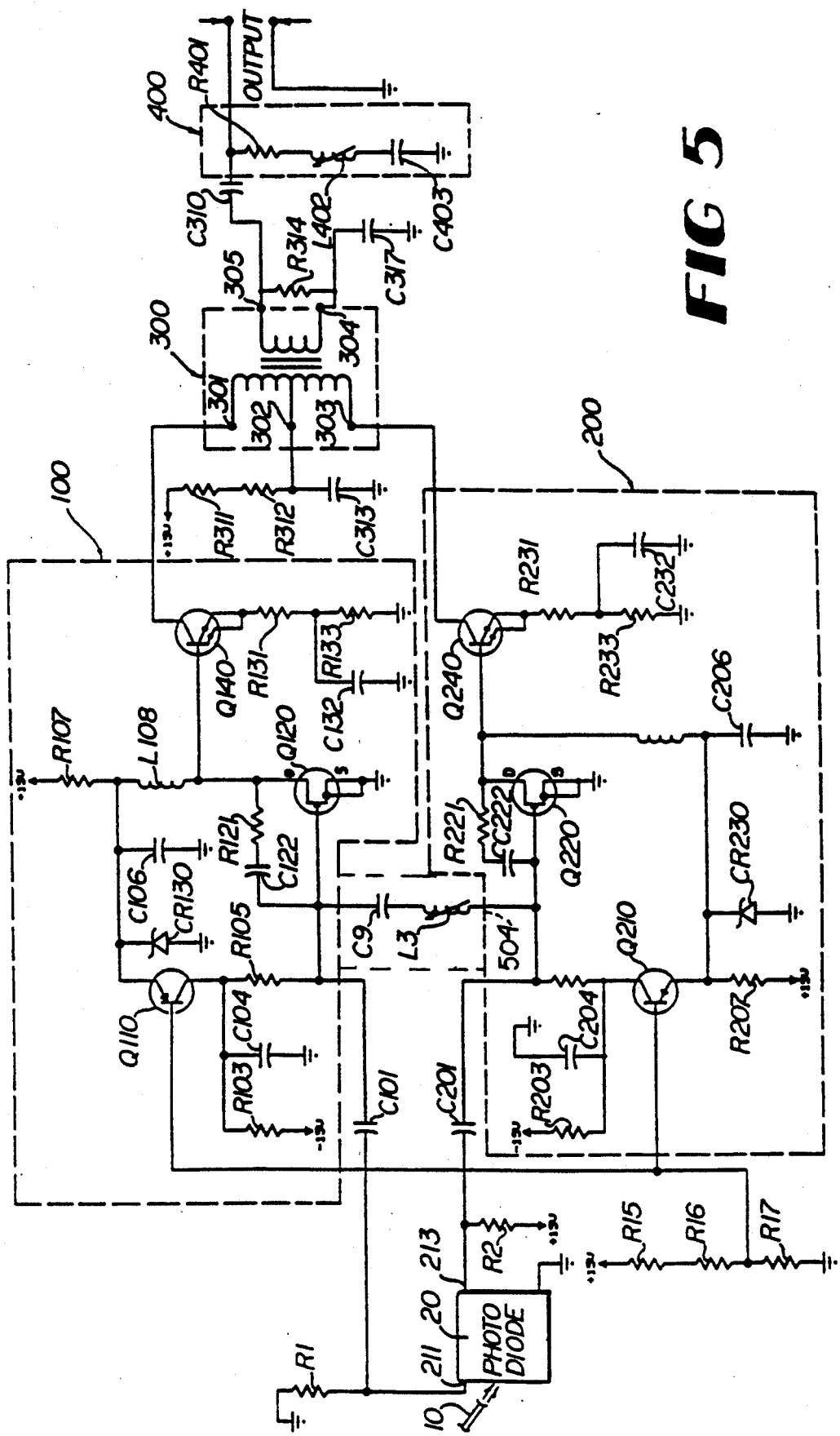
FIG. 5 is a detailed schematic of a presently preferred embodiment of the present invention.

FIG. 5 is a schematic diagram of a presently preferred embodiment of the invention. Referring to FIG. 5, the photodetector 20 which is preferably a photodiode, receives an optical input signal transmitted to it by an optical fiber 10. The anode terminal 211 of the photodiode is connected through a resistor R1 to ground. The cathode terminal 213 of the photodiode is connected through a resistor R2 to a DC voltage, which in the preferred embodiment is +15 volts. Terminal 211 of the photodiode feeds a first transimpedance amplifier 100 through a DC blocking capacitor C101. DC blocking capacitor C101 is a 0.01 microfarad ceramic capacitor, as are all of the other capacitors shown in FIG. 5 unless otherwise noted. The other terminal 213 of the photodiode feeds a second transimpedance amplifier 200 through a DC blocking capacitor 201. Both of these transimpedance amplifiers 100 and 200 are configured identically, and the following description of the transimpedance amplifier 100 also applies to the transimpedance amplifier 200. In this regard it will be noted that the tens and units digits of the identification number of each component in amplifier 100 are identical to the tens and units digits of the identification numbers in corresponding components of the amplifier 200.

The transimpedance amplifier 100 is built around a field effect transistor Q120, the source ("S") terminals of which are connected to ground. A feedback path is provided between the drain ("D") terminal of the field effect transistor Q120 by a feedback resistor R121. The feedback resistor R121 is selected in accordance with the application into which the amplifier is to be placed. For example, if the optical fiber 10 feeding the photodiode 20 is relatively long and the intensity of the light fed to the photodiode 20 is relatively low, correspondingly small currents will be produced by the photodiode 20. It is desireable that the output voltage of the optical receiver be independent of the intensity of the light fed to the photodetector 20. Since a small current flowing through a large impedance will produce the same voltage as a large current flowing a small impedance, it is desireable for the respective transimpedances of the transimpedance amplifiers 100 and 200 to be relatively high when these amplifiers are used to amplify signals producing by relatively small input currents. A receiver which will be driven by relatively high input currents should incorporate transimpedance amplifiers with correspondingly lower transimpedances. The transimpedance of the transimpedance amplifier stage comprising the field effect transistor Q120 and the feedback resistor R121 is approximately equal to $R121 + V_G/1 + V_G$ where $V_{G1}$ (the voltage gain of stage 1) is equal to $G_m Z$ parallel and Z parallel is equal to $R_d$ of the GaAsFET in parallel with R121 and the loss component of L108 (which is nominally 600 ohms resistive in the frequency range of interest here. The output capacitance of Q120 is relatively small and considered to be insignificant. Thus, the transimpedance of the transimpedance amplifier stage may be varied by selecting the value of the feedback resistor R121. It will be noted that in commercially available transimpedance amplifiers packaged in integrated circuits, such selection of a feedback resistor is not easily accomplished by the end user. Where variable feedback impedances have been used the range of transimpedances available have not been great enough to compensate for the range of light intensity values to the photodetector which may occur in a CATV system using fiber optic transmission of video signals. Moreover, nonlinearites inherent in such variable feedback impedances can constitute a serious problem in the present application. Thus, the highly linear nature of the feedback resistors used in the present design offer the advantage of allowing the amplifier to be specifically adapted for an extremely broad range of varying conditions of input signals.

In accordance with the above, when weak optical signals are applied to the photodetector 20 the feedback resistor R121 may be selected to be in the range of approximately 1,000 ohms to 2 kilohms. Where strong input signals to the photodetector 20 are expected the feedback resistor R121 may be selected to be in the 200–1,000 ohm range. For extremely narrow band transmissions (e.g., transmission of only one TV channel) or for receiving a low intensity optical signal from an extremely long fiber optic path, feedback resistors of over 2 kilohms may be selected. Such resistors would also be suitable for narrowband data transmission applications.

The gate of the field effect transistor Q121 is connected to the incoming RF signal passing through blocking capacitor C101. The DC voltage which is applied to the gate of the field effect transistor Q120 is effectively controlled by a bias regulating circuit built around transistor Q110. The base of transistor Q110 is connected to ground through a resistor R17 and to the +15 volt power supply through resistors R16 and R15. R15, 16 and 17 are selected to provide an input bias reference voltage to the base of transistor Q110 of approximately +3 volts. The collector of transistor Q110 is connected to ground through a blocking capacitor C104 and to a −15 volt DC supply through a resistor R103. The collector of transistor Q110 is also connected to the gate of field effect transistor Q120 through an inductor L105. The emitter of transistor Q110 is connected to the +15 volt DC power through a resistor R107 and back to the drain of the field effect transistor Q120 through an inductor L108 which is a high impedance to radio frequency signals. Paths to ground from the emitter of transistor Q110 are provided by a blocking capacitor 106 and a Zener diode CR130 which is normally non-conducting and functions to limit the source to drain voltage of Q120 during turn on/off or during power interruptions. The Q120 is preferably a gallium arsenide field effect transistor (GaAsFET) with a maximum voltage rating of 5 volts.

In the above circuit the base to emitter voltage drop across the transistor Q110 is approximately 0.7 volts. Thus, if the transistor is conducting, the voltage at the emitter of transistor Q101 will be approximately +3.7 volts.

In the above circuit, the inductor L108 functions to behave as short circuit to DC signals and to behave as a pure reactive component to AC signals at the radio frequencies in question (i.e. over 50 MHz). Preferably, L108 will appear to be an impedance of approximately 600 to 700 ohms at frequencies in the 50 MHz to 550 MHz range.

The drain terminal of the field effect transistor Q120 is connected to terminal 301 at the primary winding of the output transformer 300 via a high input impedance buffer amplifier stage. This buffer amplifier stage includes a transistor Q140 whose sources are connected to ground through a resistor R131 and a resistor R133. A radio frequency path to ground is provided from a point in the circuit between resistor R131 and R133 by a bypass capacitor C132. The drain of the transistor Q140 is connected to the terminal 301 at the primary winding of the output transformer 300 and the gate of Q140 is connected to the drain terminal of the field effect transistor Q120.

Q140 has the characteristic of an amplifier with a source resistance path which is high enough to minimize any loading of the previous stage thus providing a buffer between the input GaAsFET and the amplifier output.

The output transformer 300 is a 4 to 1 impedance matching transformer which is operable in the 40 MHz to 1 GHz range. An example of a transformer which is suitable for use as the transformer 300 is the Toko part No. 458DB-1013. The terminal 303 at the primary winding of the output transformer is connected to the output of the other transimpedance amplifier 200. The center tap terminal 302 at the primary winding is connected to the +15 volt power supply through resistors R312 and R311 and to ground through a blocking capacitor C313. The transformer 300 preferably has a 2 to 1 turns ratio or a 4 to 1 impedance ratio. The transformer 300 acts to transform the unbalanced load impedance at its output terminals 305 and 304 to a balanced load for the drains of the transistors Q140 and Q240. The circuitry connected to the center tap terminal 302 of the primary winding of the transformer provides an AC short to ground at that point and also drops the DC voltage to an optimum operating level.

A resistor R314 may, optionally, be connected across the output terminals 305 and 304 of the output transformer 300 to improve the impedance match (e.g., 75 ohms) to any standard CATV coaxial equipment (not shown) fed by the output transformer 300. Blocking capacitor C317 provides a path from terminal 304 to ground for r.f. signals, and blocking capacitor C310 provides a path for the radio frequency signal to the output terminals of the receiver. The output of the receiver may, optionally, be connected to an equalization network 400 comprising a resistor 401 connected in series to a variable inductor L402 which in turn is connected through a capacitor C403 to ground. In the preferred embodiment, inductor L402 is of the slug-tuned type. The equalization network 400 is utilized to correct for any nonlinearities in the response of the receiver caused by imperfections in the remainder of the circuitry.

Another feature of the receiver of the present invention is that the gates of the field effect transistors Q120 and Q220 are connected to each other by a tuning network 500 comprising a capacitor C9 and variable inductor L3. Preferably, inductor L3 is a slug-tuned inductor. The purpose of the inductor L3 is to compensate for the capacitance of the photodiode 20, the stray capacitance of the interconnecting circuitry, and the input capacitance of the GaAsFETs Q120 and Q220. L3 is adjusted so that a frequency response will be obtained which peaks at the geometric mean of the center of the band of operation. In the preferred embodiment illustrated, the amplifier has a response ranging from 50 to 550 MHz. The inductor L3 is thus adjusted to obtain a broad peak in response at 166 MHz. It should be noted that the variable inductor L3 also provides means for shifting the useful band of operation of the amplifier for special applications.

The circuit illustrated by FIG. 5 operates in the following manner. Optical energy is transmitted to the photodiode detector 20 via the optical fiber 10. The photodiode 20 is reversed biased by the biasing network comprising resistors R1, R2, and the +15 V power supply. This reverse bias ensures that the photo diode 20 operates in its most linear region. In the presence of light from the optical fiber 10 the current flowing through the photodiode 20 is determined by the responsivity of the photodiode 20 and the incident optical power applied to the input of the photodiode. This current will typically range between approximately 50 and 1,000 microamperes. When there is r.f. modulation of the amplitude of the light carried by fiber 10, the composite current through the photodiode will also have an r.f. amplitude component corresponding to the intensity modulation of the light from fiber 10. This r.f. component, which comprises the video signals transmitted over the optical fiber 10 in a CATV system, flows through the low impedance radio frequency path provided by blocking capacitors C101 and C201 and thereby to the gate circuits of field effect transistors Q120 and Q220 of the respective transimpedance amplifiers 100 and 200. As indicated above, the feedback resistors R121 and R221 of the respective transimpedance amplifiers 100 and 200 are selected to provide input impedances which are suitably matched to the input signals to the transimpedance amplifiers 100 and 200 produced by the photodiode 20. When the fiber optic path 10 is long and the light intensity at its output to photodiode 20 is low, thus resulting in photodiode 20 providing a relatively low level input signal to the transimpedance amplifiers 100 and 200, relatively high resistance values (e.g., in a range of 1,000 to 2,000 ohms) are selected for the values of R121 and R221. For applications in which relatively high input signals to the transimpedance amplifiers are expected to be generated by the photodetector 20, relatively low resistance values (e.g., in the range of 200 to 1,000 ohms) are selected for R121 and R221.

Q110 and Q210 and their associated circuitry provide bias regulation for the transimpedance amplifiers 100 and 200, respectively. They control the voltage which is applied to the gates of the field effect transistors Q120 and Q220 to regulate the drain to source current flow. For optimum linearity it is preferable to hold the drain current flow to a range of approximately 25 milliamps d.c. Referring to the transimpedance amplifier 100, for example, this regulation of current flow is accomplished in the following manner. The transistor Q110 has an input reference voltage which is derived from the +15 volt power supply by the resistor network comprising resistors R15, R16 and R17. In the preferred embodiment, this resistor network produces a voltage at the base of transistor Q101 of approximately +3 volts. The emitter to base voltage drop across transistor Q110 is approximately 0.7 volts. Thus, when transistor Q110 is conducting and the voltage at the resistor R107 and inductor L108 is approximately 4 volts, L108 functions to minimize the r.f. load admittance on the drain of Q120 thereby preserving the available voltage gain of Q110. L108 also provides a low d.c. resistance path for the drain current of Q120.

A Zener diode CR130 connected, between the emitter of Q110 and ground facilitates the process of applying or removing power from the circuitry illustrated in FIG. 5. CR130 does not function during normal operation (i.e., it appears to be an open circuit). While power is being turned on or off, however, CR130 acts as a voltage limiter to prevent the drain voltage of GaAsFET Q120 from exceeding its rated voltage, 5 V nominal, thereby preventing damage to the GaAsFET.

The magnitudes of the respective output signals of field effect transistors Q120 and Q220 are determined by the input currents applied to these transistor circuits multiplied by the circuit transimpedance which, as explained above, follow is determined by the value of the respective feedback resistors R121 and R221. The r.f. voltage signals at the drains of transistors of Q120 and Q220 are fed respectively to the gate circuits of the high impedance buffer amplifiers formed by Q140 and Q240 and their associated circuitry. The outputs of these buffer amplifiers are applied to the terminals 301 and 303 of the primary winding of output transformer 300.

The output transformer 300 is set up in a balanced configuration which is advantageous for the push-pull amplifier application. It serves to match the output of the buffer amplifier stages to a conventional coaxial cable system for further distribution to homes connected to the coaxial cable system.

While there have been described above the principles of the present invention in conjunction with specific apparatus, it is to be clearly understood that this description is made only by way of example and not as a limitation to the scope of the invention which is defined in the appended claim.

We claim:

1. An optical receiver circuit for an incoming optical signal having broadband radio frequency amplitude modulation, said circuit comprising:
   an optical detector for receiving said optical signal and generating therefrom a current signal which varies with the optical signal power level;
   first means for amplifying said current signal;
   second means for amplifying said current signal; and
   means for coupling said first amplifying means and said second amplifying means in a push-pull relationship to add the amplified current signal from said first amplifying means and the amplified current signal from said second amplifying means.

2. An optical receiver circuit in accordance with claim 1 wherein said optical detector is a photodiode.

3. An optical receiver in accordance with claim 2 wherein said photodiode is electrically biased to conduct an electrical current only when it is activated by said incoming optical signal.

4. An optical receiver in accordance with claim 1 wherein said current signal is a direct current with an amplitude component related to the amplitude modulation of the incoming optical signal.

5. An optical receiver in accordance with claim 1 further comprising
means operatively connected to said first amplifying means and to said second amplifying means for optimizing the amplification of a selectable band of radio frequencies.

6. An optical receiver in accordance with claim 5 wherein said optimizing means comprises a tuning network connected to an input terminal of said first amplifier means and an input terminal of said second amplifying means.

7. An amplifier adapted to amplify an electrical signal generated by an optical detector which varies with an optical signal power level applied to the optical detector, said amplifier comprising:
first transimpedance means for amplifying said electrical signal including a feedback impedance coupled between its output and input;
second transimpedance means for amplifying said electrical signal including a feedback impedance coupled between its output and input; and
power combining means for coupling said first amplifying means and said second amplifying means in a push-pull relationship.

8. An amplifier in accordance with claim 7 further comprising:
means operatively connected to said first amplifying means and to said second amplifying means for optimizing the amplification of a preselected band of radio frequencies.

9. An amplifier in accordance with claim 8 wherein said optimizing means comprises:
a tuning network connected to an input terminal of said first amplifying means and an input terminal of said second amplifying means.

10. An optical receiver circuit for an incoming optical signal having broadband radio frequency amplitude modulation, said circuit comprising:
an optical detector for receiving said optical signal and generating therefrom an electrical signal which varies with the optical signal power level;
first means for amplifying said electrical signal;
second means for amplifying said electrical signal;
means operatively connected to said first amplifying means and to said second amplifying means for optimizing the amplification of a selectable band of radio frequencies including a tuning network comprising a variable inductor connected between an input terminal of said first amplifying means and an input terminal of said second amplifying means, said band of radio frequencies being selectable by varying the value of said inductor; and
means for coupling said first amplifying means and said second amplifying means in push-pull relationship.

11. An optical receiver in accordance with claim 10 wherein said variable inductor comprises a slug-tuned inductor, said receiver further comprising a capacitor connected in series circuit relationship with said variable inductor.

12. An optical receiver circuit for an incoming optical signal having broadband radio frequency amplitude modulation, said circuit comprising:
an optical detector for receiving said optical signal and generating therefrom an electrical signal which varies with the optical signal power level;
first means for amplifying said electrical signal;
wherein said first amplifying means and said second amplifying means each comprising a transimpedance amplifier stage including a field effect transistor having a gate terminal, a drain terminal and a source terminal, each of said gate terminals being connected to a terminal of said optical detector through a respective blocking capacitor;
wherein the drain terminal of each field effect transistor is connected to the gate terminal of the same field effect transistor through a selectable feedback resistor; and
means for coupling said first amplifying means and said second amplifying means in push-pull relationship.

13. An optical receiver in accordance with claim 12 wherein aid first amplifying means and said second amplifying means each further comprise:
a high impedance buffer amplifier stage having an input terminal connected to the drain terminal of its respective transimpedance amplifier stage and an output terminal connected to a terminal of said push-pull connecting means.

14. An optical receiver in accordance with claim 13 wherein said push-pull coupling means comprises a transformer including:
a primary winding having a first terminal at one end thereof connected to the output terminal of said first amplifying means, a second terminal at the other end thereof connected to the output terminal of said second amplifying means and a third terminal connecting an intermediate section of said secondary winding to ground through a DC blocking capacitor; and
a secondary winding having output terminals adapted for connection to a CATV coaxial cable.

15. An amplifier adapted to amplify a signal generated by an optical detector which varies with an optical signal power level applied to the optical detector, said amplifier comprising:
first means for amplifying said signal;
second means for amplifying said signal;
means operatively connected to said first amplifying means and to said second amplifying means for optimizing the amplification of a preselected band of radio frequencies including a tuning network comprising a variable inductor connected between an input terminal of said first amplifying means and an input terminal of said second amplifying means; and
means for coupling said first amplifying means and said second amplifying means in a push-pull relationship.

16. An amplifier in accordance with claim 15 further comprising a blocking capacitor connected in series circuit relationship with said variable inductor.

17. An amplifier adapted to amplify a signal generated by an optical detector which varies with an optical signal power level applied to the optical detector, said amplifier comprising:
- first means for amplifying said signal;
- second means for amplifying said signal;
- wherein said first amplifying means and said second amplifying means each comprise a transimpedance amplifier stage including a field effect transistor having a gate terminal, a drain terminal and a source terminal, each of said gate terminals being connected to an input terminal of said amplifier through a respective DC blocking capacitor;
- wherein the drain terminal of each field effect transistor is connected to the gate terminal of the same field effect transistor through a selectable feedback resistor; and
- means for coupling said first amplifying means and said second amplifying means in a push-pull relationship.

18. The amplifier of claim 17 wherein said first amplifying means and said second amplifying means each further comprise a high impedance buffer amplifier stage having an input terminal connected to the drain terminal of the respective transimpedance amplifier stage and an output terminal connected to a terminal of said push-pull connecting means.

19. The amplifier of claim 18 wherein said push-pull coupling means comprises a transformer including:
- a primary winding having a first terminal at one end thereof connected to the output terminal of said first amplifying means, a second terminal at the other end thereof connected to the output terminal of said second amplifying means, and a third terminal connecting an intermediate portion of said secondary winding to ground through a DC blocking capacitor;
- a secondary winding having output terminals adapted for connection to a CATV coaxial cable.

* * * * *